United States Patent

[11] 3,594,493

[72] Inventors Alan Michael Kauffman
Edgeware;
James Bond, Camberley, both of, England
[21] Appl. No. 866,075
[22] Filed Oct. 2, 1969
[45] Patented July 20, 1971
[73] Assignee Elliott Brothers Limited
London, England
[32] Priority Oct. 2, 1968
[33] Great Britain
[31] 46,773/68

[54] PRINTED CIRCUIT ASSEMBLIES AND METHOD
3 Claims, 13 Drawing Figs.

[52] U.S. Cl. 174/68.5, 29/625, 304/15, 339/17, 29/626
[51] Int. Cl. H05k 1/18, H05k 3/36
[50] Field of Search 174/68.5; 317/101 B, 101 C, 101 CC, 101 CM, 101 D, 101 CW; 29/625—627; 204/15; 339/17, 17 M

[56] References Cited

UNITED STATES PATENTS

| | | | |
|---|---|---|---|
| 3,052,823 | 9/1962 | Anderson et al. | 174/68.5 X |
| 3,060,076 | 10/1962 | Robinson | 174/68.5 UX |
| 3,451,131 | 6/1969 | Gruenstein | 317/101 CW X |
| 3,501,831 | 3/1970 | Gordon | 174/68.5 X |

*Primary Examiner*—Darrell L. Clay
*Attorney*—Kirschstein, Kirschstein, Ottinger & Frank

ABSTRACT: A multilayer printed circuit assembly has connections between the layers formed by extending a printed circuit conductor from each layer through a number of aligned holes in the different layers to the outer surface of the assembly where the end faces of the conductors terminate in the same plane. A plated layer then interconnects the end faces. Component leads may also extend through holes to the connection plane. The assembly is potted in stages.

INVENTORS
ALAN M. KAUFFMAN
JAMES BOND

BY Kirschstein, Kirschstein, Ottinger & Frank
ATTORNEYS

INVENTORS
ALAN M. KAUFFMAN
JAMES BOND

BY Kirschstein, Kirschstein, Ottinger & Frank
ATTORNEYS

INVENTORS
ALAN M. KAUFFMAN
JAMES BOND

BY Kirschstein, Kirschstein, Ottinger & Frank
ATTORNEYS

PRINTED CIRCUIT ASSEMBLIES AND METHOD

This invention relates to printed circuit assemblies. It is particularly concerned with manufacturing and inspection difficulties occurring in the interconnection of printed circuit conductors and component conductors in such assemblies.

According to one aspect of the present invention, a printed circuit assembly includes a layer of insulating material through a hole or holes in which a plurality of electrical conductors extend to terminate substantially flush with a surface of the layer, the end faces of the conductors being interconnected by a pad of conducting material formed on the said surface.

One or more of said conductors may be part of one or more printed circuit conducting layers of the assembly. One or more of said conductors may be a terminal conductor of a circuit component, for example an integrated circuit device, included in the assembly.

The hole may be aligned with a hole in each of one or more printed circuit boards forming part of the assembly, the holes providing access to the surface of the layer of insulating material for said conductors. Preferably, for each of said printed circuit boards the conducting layer of which provides one of said conductors terminating in said surface, the said hole in the printed circuit board is provided by the removal of the insulating substrate and the severing and deformation of the overlying conducting layer towards said surface.

According to another aspect of the invention, a method of forming interconnections between electrical conductors in a printed circuit assembly, includes the steps of causing conductors which are to be interconnected to pass through a hole or holes in a layer of insulating material, removing the ends of the conductors projecting from the layer so that the end faces of the conductors terminate at a surface of the layer and forming an interconnection pad of electrically conducting material on the surface to interconnect the end faces of the conductors.

The pad is preferably formed as a layer of copper electroplated onto said surface, the area of the pad is defined by a layer of gold, and the copper not protected by the gold is etched away. In addition to providing local interconnection between the end faces of terminal conductors the pad may constitute part of a more extensive printed circuit layer.

Figure 1:
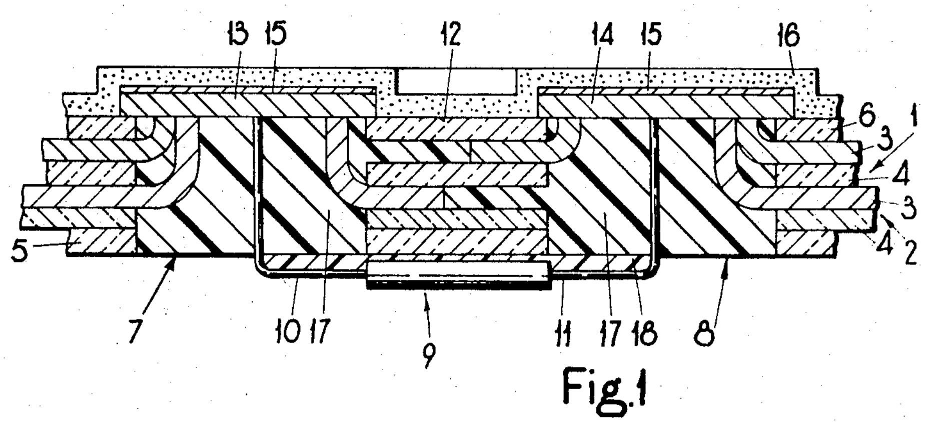
Figure 5:
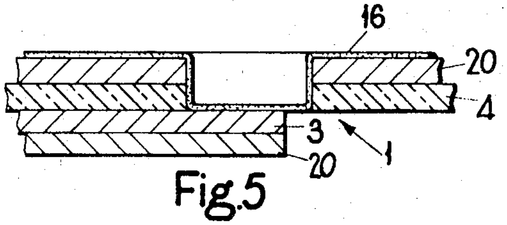
Figure 6:
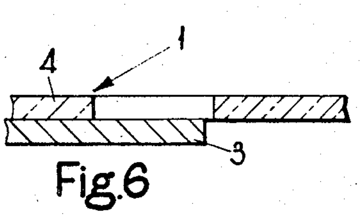
Figure 7:
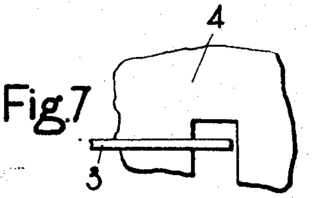
Figure 10:
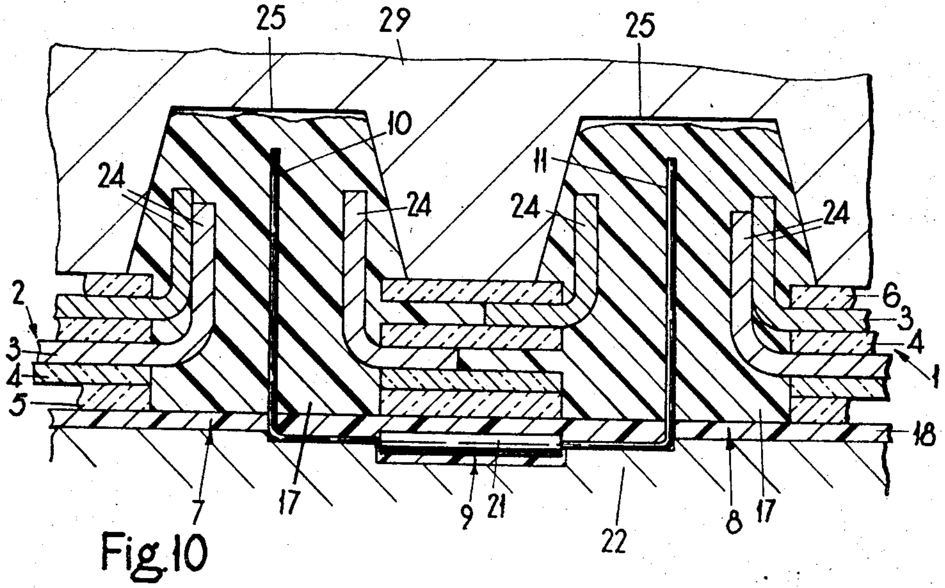
Figure 11:
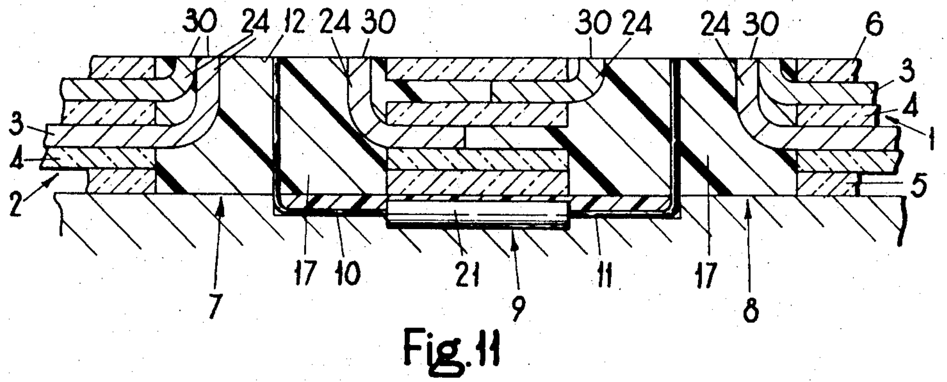
Figure 12:
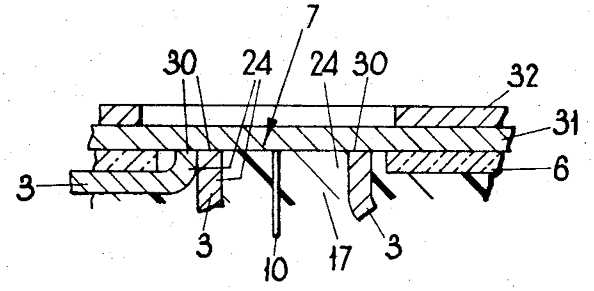
Figure 13:
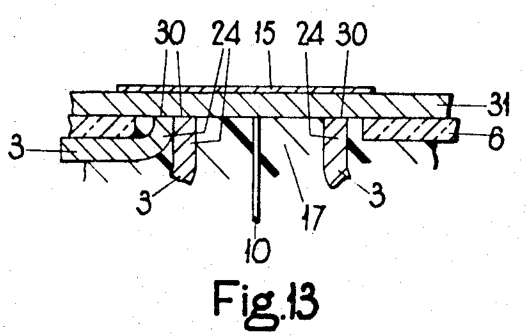

One form of printed circuit assembly and a method of manufacturing such an assembly according to the invention will now be described, by way of example, with reference to the accompanying diagrammatic drawings in which:

FIG. 1 is a sectional elevation of part of the assembly,

FIG. 2 to 7 illustrate a first stage of the method in which a layer of printed circuit is manufactured, FIGS. 2 to 6 being sectional side elevations and FIG. 7 being a plan, FIGS. 8 to 11 are sectional side elevations illustrating a second stage of the method in which an integrated circuit device and two layers of printed circuit are assembled, and FIGS. 12 to 13 are sectional side elevations illustrating a third stage of the method in which conductors of the integrated circuit device and of the two layers of printed circuit are interconnected by interconnection pads.

Referring to FIG. 1, two layers 1 and 2 of printed circuit each comprise a layer 3 of copper conductor (which will generally be a pattern of strip conductors) and a layer 4 of epoxy-glass substrate. The two layers 1 and 2 are sandwiched between layers 5 and 6 of epoxy-glass material.

The layers 4, 5 and 6 of epoxy-glass material have cooperating holes 7 and 8 formed therein into which the layers 3 of conductor project and are bent to extend through the layer 6.

An integrated circuit device 9 has conductors 10 and 11 which project through the holes 7 and 8, respectively. The layers 3 of conductor and the conductors 10 and 11 terminate flush with the surface 12 of the layer 6 of epoxy-glass remote from the device 9. The end faces of the conductors 3 and 10 associated with hole 7 are interconnected by a substantially flat pad 13 of copper and the end faces of the conductors 3 and 11 associated with hole 8 are interconnected by a substantially flat pad 14 of copper. The pads 13 and 14 are covered with a layer 15 of gold and the gold covered pads and the surrounding surface of the layer 6 are coated with a layer 16 of lacquer.

The spaces outlined by the holes 7 and 8 are filled with a filled epoxy-resin potting compound 17 and the device 9 is potted in a silicone compound 18.

The assembly described with reference to FIG. 1 is manufactured by the following method which is divided into the above-mentioned three stages, namely (1) the preparation of a printed circuit layer, (2) the assembly of prepared printed circuit layers and components, and (3) the making of the interconnections

THE FIRST STAGE

1a. The layer 1 of printed circuit, which comprises a layer 4 of epoxy-glass material to which is attached a layer 3 of copper, is coated on the side of the epoxy-glass material remote from the copper with a negative-working photoresist material 20 (that is, one that is rendered insoluble by exposure to ultraviolet light).

1b. The photoresist material 20 is exposed to ultraviolet light through a "hole pattern" master. Opaque regions of the master correspond to holes required in the layer 4 of epoxy-glass material.

Figure 2:
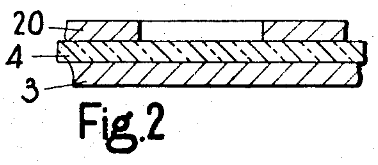

1c. The photoresist material 20 is developed to form a mask in which areas of the layer 4 of epoxy-glass material, in which holes are to be formed, are exposed (FIG. 2 shows one such area).

Figure 3:
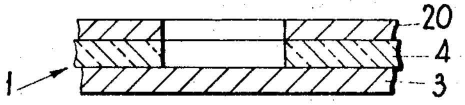

1d. The exposed areas of the layer 4 of epoxy-glass material are etched away by alternate dips in sulfuric acid and hydrofluoric acid solutions. The photoresist material 20 and the layer 3 of copper are substantially unattacked. This leaves a layer 1 of printed circuit in which holes are formed through the layer 4 of the epoxy-glass material (FIG. 3 shows one such hole).

1e. The surface of the layer 3 of copper remote from the layer 4 of epoxy-glass material is coated with a negative-working photoresist material 20 and this coating is then exposed, through a "track pattern" master to ultraviolet light. Regions of the "track pattern" master representing areas of the layer 3 of copper which are required as conductors are transparent. The "track pattern" master is aligned with the hole position in the layer 4 of epoxy-glass material by means of a Kodak (Registered Trade Mark) pin bar system of registration.

Figure 4:
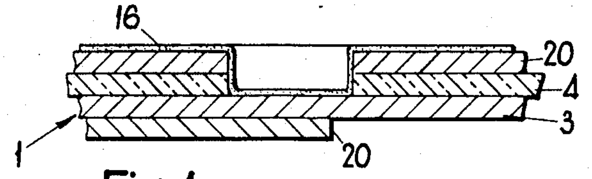

1f. The photoresist material 20 is developed thereby producing a mask through which the areas of the layer 3 of copper material not required as conductors are exposed. The copper exposed by the holes in the layer 4 of epoxy-glass material is protected by a coating of stopping-off lacquer (FIG. 4 shows one such hole).

1g. Unmasked areas of the layer 3 of copper are etched away by a ferric chloride solution (FIG. 5).

1h. Residual chemicals and photoresist material 20 are removed from the finished printed circuit layer (FIGS. 6 and 7).

THE SECOND STAGE

2a. The output leads in the form of conductors 10 and 11 of an integrated circuit device 9 are bent at right angles to the plane of the body 21 of the device by a bending jig.

Figure 8:
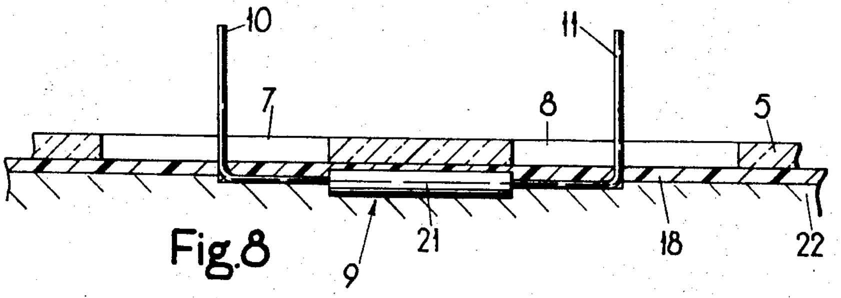

2b. As shown in FIG. 8, the device 9 is placed in a jig 22 which locates the conductors 10 and 11 accurately. The bends in conductors 10 and 11 together with the body 21 are potted in a silicone compound 18 leaving the ends of the conductors 10 and 11 bare.

2c. An epoxy-glass plate 5 is placed over the projecting bare conductors 10 and 11, as shown in FIG. 8, so that they protrude through holes 7 and 8 punched in the plate 5. The plate 5 rests on the surface of the solidified silicone potting compound 18.

Figure 9:
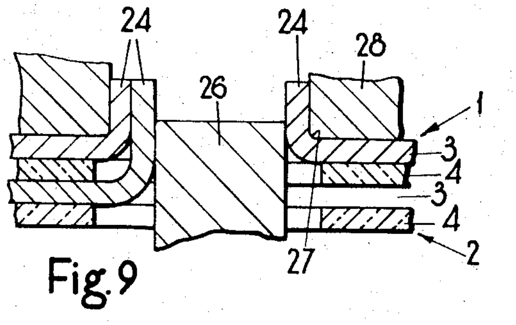

2d. Two layers of printed circuit 1 and 2, prepared as in the first stage are assembled in a punching jig (not shown) which holds them in registration one above the other, and the copper tabs 24 formed by the ends of the conductors 3, which overhang holes 7 and 8 in the layers 4 of epoxy-glass material, are bent at right angles to the plane of the circuits using a punch 26 as shown in FIG. 9. The layer 1 has two such copper tabs 24 and the layer 2 has one. The punch 26 passes through the holes 7 and 8 and bends the copper tabs 24 away from their associated layers 4 of epoxy-glass material and round the shoulders 27 of a die 28 associated with the punch 26 (FIG. 9 shows only the parts of the punch 26 associated with hole 7).

2e. The two-layer assembly is removed from the jig, the layers of printed circuit 1 and 2 being held together in the absence of the punching jig by friction between the bent tabs 24.

2f. The assembly of FIG. 9 is placed on the exposed surface of the epoxy-glass plate 5 of FIG. 8 so that the conductors 10 and 11 project through the holes 7 and 8 as shown in FIG. 10. The exposed face of the assembly with the tabs 24 and conductors 10 and 11 projecting therefrom is covered with an epoxy-glass plate 6. The tabs 24 and conductors 10 and 11 project through holes punched in the epoxy-glass plate 6. The alignment of the complete assembly is achieved by the use of two pins (not shown) in the jig 22 which pass through accurately etched holes in the various layers 1, 2, 5 and 6.

2g. A filled epoxy-resin potting compound 17 is injected via the holes in the plate 6 to completely fill the spaces (including the holes 7 and 8) in and between the various layers 1, 2, 5 and 6. The spaces are evacuated to ensure thorough degassing and pressure is applied, by means of a polytetrafluoroethylene (PTFE) pressure plate 29, to flatten and consolidate the complete assembly. Cavities 25 in the pressure plate 29 ensure that the projecting tabs 24 and conductors 10 and 11 are not fouled and provide a passage by which excess potting resin can flow from the complete assembly. The assembly thus potted is shown in FIG. 10.

2h. The complete assembly is subjected to a heating cycle to cure the potting resin. The temperatures are maintained below values at which the device 9 would be harmed.

2i. The complete assembly, after curing of the potting resin, is removed from the pressure plate 29, and the excess resin, tabs 24 and conductors 10 and 11 are ground away to expose the epoxy-glass plate 6 with the end faces 30 of the tabs 24 and conductors 10 and 11 flush with the flat surface 12 produced. This stage is shown in FIG. 11. The jig 22 is removed together with any excess silicone compound still adhering to the body 21 of the d device 9. A thin layer of the silicone compound is left between the body 21 and the epoxy-glass plate 5.

2 j. The ground surface 12 is evenly sand blasted to provide a mechanical keying surface for subsequent operations.

THE THIRD STAGE

3a. The assembly is degreased.

3b. The degreased assembly is coated with lacquer on the device (9) side thereof only.

3c. A layer of copper (not shown) approximately 25 microinches thick is deposited by an electroless process over the entire surface of the lacquered assembly.

3d. The thin coating of copper on the ground surface 12 of the lacquered assembly is built by electroplating in an acid copper sulfate bath to form a layer 31 (shown in FIG. 12) of copper having a thickness of approximately 0.0005 inch.

3 e. The plated surface 31 is coated with a layer of positive-working photoresist material 32 (i.e. one which is rendered soluble by exposure to ultraviolet light).

3f. The photoresist material 32 is exposed to ultraviolet light by way of a "pad pattern" master in which areas of copper required to form the pads 13 and 14 are represented by transparent areas. The master is aligned with the complete assembly by pins, mounted on an exposure jig, which pass through corresponding holes in the complete assembly and "pad pattern" master.

3g. The photoresist material 32 is developed to form a mask defining by leaving bare the areas where the pads 13 and 14 are to be formed (FIG. 12).

3h. The pad areas are electroplated with gold to a thickness of approximately 0.00015 inch.

3i. The photoresist material 32 remaining is dissolved by a suitable solvent leaving the layer 31 of copper bare except where protected in the pad areas by the gold plate 15 (FIG. 13).

3j. All exposed copper, including the layer 31 where not protected by the gold plate 15, is etched away by a ferric chloride solution leaving the isolated gold-plated copper pads 13 and 14 each of which electrically interconnect the end faces 30 associated with a hole, as shown in FIG. 1.

3k. The surface 12 and the pads are coated with a lacquer 16.

In an alternative construction the layer 31 of copper is coated with a negative-working photoresist material from which a mask is formed to permit the layer 31 of copper to be etched away except where pads are required and the layer 31 of copper is etched to leave the interconnection pads. The remaining photoresist material is then dissolved and the side of the complete assembly including the pads coated with a lacquer.

In a further alternative construction the ground surface 12 coated by an electroless process with a layer of copper (see step 3c above) is coated with a layer of photoresist material which is exposed to ultraviolet light by way of a "pad pattern" master and developed to produce a mask in which the pad areas are left bare. A layer of copper, approximately 0.0005 inch thick is deposited on the bare areas and the photoresist mask dissolved. The exposed areas of the layer of copper deposited by an electroless process are then dissolved away by a brief immersion in a ferric chloride solution; the thick interconnection pads being left almost intact. The completed assembly is then coated with a lacquer.

It can be seen that according to the above method a multilayer circuit is provided in which all the interconnections are formed in a single plane, and all of which, between both printed conductors and component leads are made in one plating pass.

The resulting simplification of manufacture an inspection of circuits brings about a considerable saving in costs.

We claim:

1. A printed circuit assembly comprising a plurality of superimposed printed circuits each including an insulating layer and a conductor layer, the printed circuits being arranged with the conductor layers and the insulating layers alternating, each said conductor layer having a number of integral conductor portions, said conductor portions being bent transversely to said printed circuits and extending through holes in said insulating layers, said assembly further comprising an outer insulating layer with holes therein through which said conductor portions extend, said outer insulating layer having planar outer surface in which the ends of said conductor portions terminate, said holes in said outer insulating layer being filled with potting compound with said planar outer surface being continuous in the regions of termination of said conductor portions, and a pattern of conductive material formed on said planar outer surface to interconnect predetermined ones of said conductor portions.

2. A printed circuit assembly according to claim 1 comprising at least one circuit component having a terminal conductor extending through holes in said insulating layers to said planar outer surface for interconnection with predetermined ones of said conductor portions.

3. A method of forming interconnections between electrical conductor layers in a printed circuit assembly, comprising the steps of forming a number of holes in the insulating layers of a plurality of printed circuit boards, bending portions of the respective conductive layers overlying the holes to extend transversely to the printed circuit boards, superimposing said printed circuit boards with said holes in alignment and with the bent conductor portions extending through said holes, potting said conductor portions in said holes, removing those parts of the conductor portions and the potting compound extending beyond an outer planar surface of said assembly, and forming a pattern of conductive material on said planar surface interconnecting predetermined ones of said conductor portions.